United States Patent [19]

Schmidt et al.

[11] Patent Number: 5,126,742
[45] Date of Patent: Jun. 30, 1992

[54] ANALOG TO DIGITAL CONVERTER WITH DOUBLE FOLDING INTERPOLATION CIRCUITRY

[75] Inventors: Robert R. Schmidt; Alfi Moscovici, both of Colorado Springs, Colo.

[73] Assignee: Signal Processing Technologies, Inc., Colorado Springs, Colo.

[21] Appl. No.: 609,797

[22] Filed: Nov. 6, 1990

[51] Int. Cl.⁵ ............................................. H03M 1/56
[52] U.S. Cl. ...................................... 341/156; 341/169
[58] Field of Search ............... 341/156, 159, 162, 169, 341/61, 95, 120

[56] References Cited

U.S. PATENT DOCUMENTS

| | | | |
|---|---|---|---|
| 4,325,054 | 4/1982 | van de Plassche | 340/347 |
| 4,456,904 | 6/1984 | van de Grift et al. | 340/347 |
| 4,611,196 | 9/1986 | Fernandez | 340/347 |
| 4,897,656 | 1/1990 | van de Plassche et al. | 341/159 |
| 4,912,469 | 3/1990 | Van De Grift et al. | 341/159 |
| 4,985,701 | 1/1991 | Motoe et al. | 341/61 |

OTHER PUBLICATIONS

Fiedler et al., "A High-Speed 8 Bit A/D Converter Based on a Gray-Code Multiple Folding Circuit (IEEE Journal of Solid-State Circuits", vol. SC-14, No. 3., Jun., 1979, pp. 547-551).

van de Plassche et al., "A High-Speed 7 Bit A/D Converter" (IEEE Journal of Solid-State Circuits, vol. SC-14, No. 6, Dec. 1979, pp. 938-943).

van de Grift et al., "An 8-Bit Video A/D Converter" (IEEE Journal of Solid-State Circuits, vol. SC-19, No. 3, Jun. 1984, pp. 374-378).

van de Grift, et al., "An 8-bit Video ADC Incorporating Folding and Interpolation Techniques" (IEEE Journal of Solid-State Circuits, vol. SC-22, No. 6, Dec. 1987, pp. 944-953).

van de Plassche, et al., "An 8-Bit 100 -MHz Full-Nyquist Analog-to-Digital Converter" (IEEE Journal of Solid-State Circuits, vol. 23, No. 6, Dec. 1988, pp. (1134-1344).

Gilbert, "A Precise Four-Quadrant Multiplier with Subnanosecond Response" (IEEE Journal of Solid-State Circuits, vol. SC-3, No. 4, Dec. 1968, pp. 365-373).

Primary Examiner—A. D. Pellinen
Assistant Examiner—Brian K. Young
Attorney, Agent, or Firm—Sheridan Ross & McIntosh

[57] ABSTRACT

An analog to digital converter (ADC) is disclosed having a coarse converter to generate the most significant bits of the output and double folding interpolation circuitry to generate the least significant bits. Each side of the double folding circuit includes additional folding stages coupled to reference voltages above and below the full scale input range of the ADC to cancel offset errors and improve circuit linearity. The interpolation circuit includes one interpolation stage, having two multiplier networks, for each least significant bit. Each interpolation stage receives two pairs of signals from the preceding stage and outputs two pairs of signals to the next stage. One of the pairs of output signals from each interpolation stage is also sent to a latched comparator. The outputs of all of the latched comparators can be read directly as the ADC output bits without requiring a decoder.

16 Claims, 5 Drawing Sheets

ANALOG TO DIGITAL CONVERTER WITH DOUBLE FOLDING INTERPOLATION CIRCUITRY

TECHNICAL FIELD OF THE INVENTION

This invention relates to an analog to digital converter, and more particularly to an analog to digital converter having double folding interpolation circuitry employing a multiplier network.

BACKGROUND OF THE INVENTION

An analog to digital converter (ADC) is a device which converts an analog input signal into an accurate binary number (represented by the status of one or more output bits) proportional to the amplitude of the analog signal. Numerous methods exist for performing the analog to digital conversion. A full "flash" ADC is the fastest method and utilizes a set of comparators operating in parallel, each comparing the analog input signal to a different reference voltage. If the amplitude of the analog input signal is greater than the reference level, the output of the comparator will be in a high logic state; conversely, if the amplitude of the analog input signal is less than the reference level, the output of the comparator will be in a low logic state. The output of each comparator is latched and the signals at all of the outputs are sent simultaneously to a decoder, the output of which is the desired digital representation of the analog input at a particular point in time.

In order to obtain a digital output having N bits, it is necessary to provide $(2^N-1)$ comparators, latches and reference voltage levels. The reference levels are generally established through the use of precision resistors connected in series. The tap between two adjacent resistors is connected to one input of a comparator and the other input of the comparator receives the analog input signal The digital output of the comparators is in the form of a "thermometer code": when the output of a comparator P is in a high logic state, the outputs of all of the comparators "below" comparator P (coupled to reference voltages less than the reference voltage coupled to comparator P) are also in the high logic state. In a like manner, if the output of a comparator P + 1 is in a low logic state, then the outputs of all comparators above P + 1 (coupled to reference voltages greater than the reference voltage coupled to comparator P + 1) are also in a low logic state. Thus, even though the only significant information is contained at the point of transition between a comparator which is on and the comparator above it which is off, many more comparators may be in a high logic state and an equal number of latches will be latched leading to unnecessary use of circuit elements and power. Furthermore, as previously noted, a decoder is necessary to convert the thermometer code output of the comparators into useful binary information. Consequently, despite its high speed parallel operation, a flash ADC may become prohibitively expensive in terms of cost, number of parts (comparators, latches, decoder and resistor string), power consumed and space required when resolution greater than about 8 bits is required.

An alternative which requires fewer parts than a full flash converter is a sub-ranging ADC. The sub-ranger utilizes two or more smaller flash converters (one for the most significant bits (MSB) and one for the least significant bits (LSB)) and a digital to analog converter (DAC). The analog input signal is sent to the coarse flash converter which produces the most significant bits in the manner described above. The digital output from the coarse converter is converted back into an analog value by the DAC whose output is subtracted from the original analog input signal. The resulting analog difference signal is then sent to the fine flash converter where the least significant bits are produced.

By way of comparison, an 8-bit full flash converter would require $(2^8-1)$, or 255, comparators and an equal number of latches. An 8-bit sub-ranger having four most significant bits produced by the coarse converter and four least significant bits produced by the fine converter would require $(2^4-1)$, or 15, comparators and latches in each of the two converter sections for a total of 30 comparators and 30 latches. A disadvantage of the sub-ranger is that obtaining the most significant bits from the coarse converter and then converting these back into an analog signal in the DAC entails a certain amount of time. A sample-and-hold circuit is generally required at the input of the converter to hold the input signal during the analog-to-digital-to-analog operation. At certain frequencies, the slower speed of a sub-ranger, caused by the delay in the interim conversion back to analog, may be unacceptable. Furthermore, like the full flash converter, the sub-ranger requires a decoder in order to obtain useful binary information.

An analog to digital conversion technique which does not require the use of a decoder is successive approximation. In contrast to flash and sub-ranging converters, the successive approximation converter generates each bit of the output sequentially, beginning with the most significant bit, and the output can be read directly without the use of a decoder or separate coarse and fine converters. A successive approximation register (SAR) controls the operation of the converter by generating inputs to a DAC. The output of the DAC is compared to the analog input signal in a comparator whose output is coupled to the register.

The output of a SAR may be read directly without the need for a decoder while one comparator and N latches are needed for an N bit converter.

An ADC which combines the high speed performance of a full flash converter with the size and cost advantages of a sub-ranger is a folding ADC. By "folding" the changing analog input signal into two or more sections, the number of latches can be reduced significantly. For example, if the analog input signal is an increasing ramp, the output from the folding circuit is, ideally, a repetitive triangular wave-form having a frequency of K times the frequency of the input ramp, where K is the number of times the full scale input range is divided or folded into equal sections. The output is then processed by a fine converter to obtain the least significant bits. A coarse flash converter generates the most significant bits of the ADC.

Like a full flash ADC, no separate DAC is required since the folding function incorporates the DAC function. The speed of a folding ADC can compare very favorably with that of a full flash converter if care is taken to match delays between analog input and clock signals. Like a sub-ranger, fewer comparators and latches are required; thus, the cost and space requirements of a folding ADC compare favorably with those of a sub-ranger.

Nonetheless, a folding ADC has certain disadvantages which the full flash and sub-ranger do not have.

The folding circuit includes differential pairs whose outputs are non-linear for large signal excursions. A resulting disadvantage is that at the upper and lower ends of the input range, the non-linearities may occur due to incomplete switching of certain of the differential pairs in the folding circuit. The problem of such non-linearities has not been addressed in known ADC circuits.

Because of the non-ideal nature of the differential pairs, the output of the folding circuit tends to resemble a rounded triangular wave or a sinusoid rather than a perfect triangular wave. At the extreme values of the sinusoid (peak and trough) the output of the folding circuit may be nearly constant even though the input is changing. This rounding off of the ideal triangular waveform results in lower resolution of the folding circuit output One method for reducing the errors caused by rounding at the peaks and troughs of the folding circuit output is the use of two folding circuits or "sides", whose inputs connect to alternate reference ladder taps and whose outputs are offset from each other in voltage phase (for example, by 90°), together with additional circuitry which selects one or the other side depending on which is in a linear range. Thus, before the output of the first folding side leaves its linear range, the output of the second folding side enters its linear range and is selected for processing by the fine converter.

To generate L least significant bits, $2^L$ folding signals are necessary. To reduce the number of folding circuits without decreasing the resolution, or to increase the resolution without increasing the number of folding circuits, an interpolation network can be used. With this technique, additional signals can be derived between the outputs of the existing folding circuits. For example, to obtain four least significant bits from a fine flash converter, sixteen ($2^4$) folding signals are required. These may be generated from sixteen folding circuits or, alternatively, eight signals may be generated from eight folding circuits with the remaining eight signals derived by a two times interpolation network between the eight outputs of the folding circuits. This results in a 50% reduction in the number of folding circuits and associated circuit elements.

As previously noted, the differential pairs in comparators do not switch instantly between high and low outputs. Instead, the output tends to follow the input over a certain range which includes the point at which the comparator would ideally change states (the zero crossing point where the two comparator inputs are equal). To obtain an interpolated signal halfway between two folding outputs, the outputs of known interpolation circuits are coupled to a resistive divider network from which three signals, the two original signals plus one interpolated signal from a center tap between two resistors, can be obtained.

A significant disadvantage in relying upon a resistive network to generate the interpolated signals is the requirement that the resistors be extremely precise. Also, time delays between various input signal paths may not match. The spread time delays causes aperture skews that become "jitter" errors at high frequencies. The resistive network may also take up valuable space on an integrated circuit and may generate heat which must be dissipated away from the circuit.

Consequently, a need has arisen for a high resolution analog to digital converter capable of high speed/high frequency operation having a reasonable size and cost without the time delay errors and non-linearities common to existing folding circuitry.

SUMMARY OF THE INVENTION

The present invention provides a double folding analog to digital converter which includes an interpolation circuit employing a multiplier network. More particularly, the present invention includes a coarse flash converter to produce the most significant bits of the ADC output and utilizes an interpolation circuit to produce the least significant bits. In one embodiment, the coarse flash converter generates four bits and the interpolation circuit generates eight bits. The double folding circuit receives the analog input signal and "folds" it through two or more folding stages in each of two folding networks or "sides". Each side outputs two folded signals which are complements of each other. The pair of folded signals from one folding side is shifted 90° in voltage from the pair of folded signals from the other side since the reference ladder taps are coupled alternately to the two sides. The interpolation circuit receives both pairs of output signals from the two sides of the folding circuit and, using multiplier networks, generates one or more sets (of two pairs each) of interpolated signals. One or more binary output signals are output representing the least significant bits of the ADC. Two or more stages of multiplier networks can be coupled in series. Each set of interpolated signals is generated by an interpolation stage having two multiplier networks which receive the two pairs of signals from a previous stage (either from the double folding circuit or from two preceding multiplier networks). Each interpolation stage generates two pairs of output signals, the pairs being 90° apart and at twice the frequency as the signals input to the multiplier networks. Both pairs of output signals are received by a next interpolation stage and one pair is also received by a latched comparator to provide one bit of the ADC output. Greater ADC resolution (larger number of least significant bits) is provided by additional interpolation stages. In one embodiment of the present invention, eight such stages are coupled in series to provide eight least significant bits for the ADC output.

The present invention further includes a double folding circuit having additional folding stages coupled to voltage reference levels above and below the full scale input range in order to cancel end point errors and improve the linearity of the folding circuit output. Balance is restored to those folding stage which represent the upper and lower limits of the input range. And, because the new folding stages are outside of the input range, any non-linearities which affect their zero crossings will not substantially affect the overall linearity of the double folding circuit.

Consequently, the ADC of the present invention provides the technical advantages of providing higher resolution at lower cost than full flash converters and requiring less space and power than other existing conversion methods. In addition, the ADC of the present invention does not require the use of a separate digital to analog converter.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
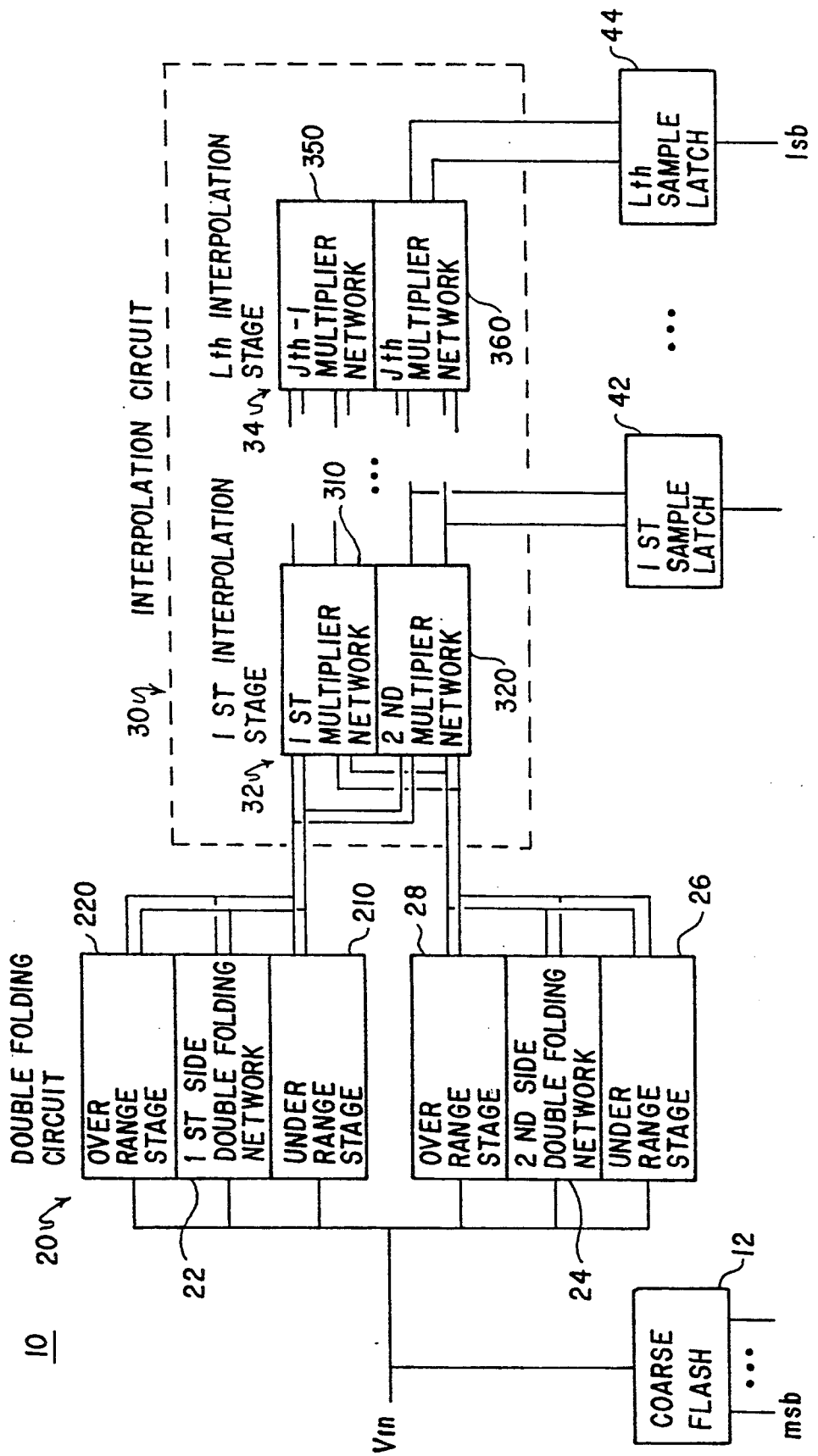
FIG. 1 illustrates a block diagram of the present invention.

The preferred embodiment of the present invention is best understood by referring to FIGS. 1-5 of the drawings, like numerals being used for like and corresponding parts of the various drawings FIG. 1 illustrates a block diagram of an analog to digital converter (ADC) 10 incorporating a double folding circuit 20 and an interpolation circuit 30 of the present invention. An analog input signal, $V_{IN}$, forms the input for ADC 10. $V_{IN}$ may be any signal with a time varying amplitude which is to be converted into digital form represented b a sequence of binary bits. Such a signal may originate, for example, in the input stages of a radar system, a digital oscilloscope, a medical imager, a spectrum analyzer or video equipment.

$V_{IN}$ is received by a coarse flash converter 12 which processes the input signal $V_{IN}$ and outputs the most significant bits of converter 10. Coarse converter 12 may be of conventional design and generates the most significant bits of ADC 10 through the use of comparators, one for each bit, operating in parallel.

Input signal $V_{IN}$ is also received by a double folding circuit 20. Double folding circuit 20 includes two folding networks, first folding network 22 and second folding network 24. First folding network 22 further includes an under range folding stage 210 and an over range stage 220 while second folding network 24 further includes an under range stage 26 and an over range stage 28.

Figure 2:
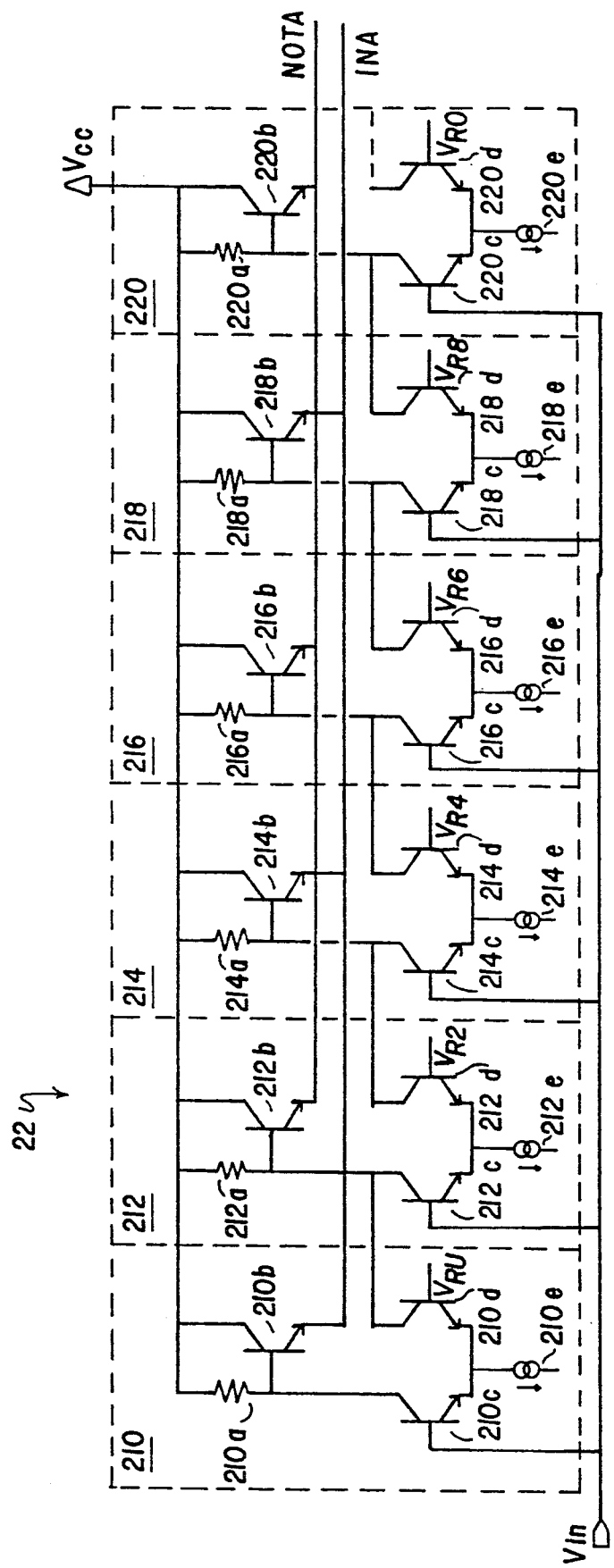
FIG. 2 illustrates a schematic diagram of one side of the folding circuit of the present invention, including the additional stages above and below the maximum and minimum, respectively, input signal levels.

FIG. 2 is a schematic diagram of first folding network 22 of double folding circuit 20. As will be discussed, second folding network 210 has the same configuration as first folding network 22. First side 22 includes two or more folding stages; in FIG. 2, there are four such stages, 212, 214, 216 and 218, as well as under range stage 210 and over rang stage 220.

In each folding stage, the folding operation is performed by a differential pair formed from first and second transistors C and D whose emitters are coupled to a current source E. The base of each first transistor C is coupled to $V_{IN}$ and the base of each second transistor D is coupled to a reference voltage. The reference voltages are provided by a resistor ladder (not shown) having voltage taps equally spaced across the input range of ADC 10. As will be explained in more detail, the resistor ladder also provides reference voltages for under range stage 210 and over range stage 220 which are below and above, respectively, the input range of ADC 10.

The collector of each first transistor C has a resistor load A. The collector of each second transistor D is coupled to the resistor load of the next folding stage. The resistor loads of the folding stages are coupled alternately to the output INA and the complementary output NOTA through each third transistor B with wired-OR connections.

If a ramp, having a frequency F, is input into first folding network 22 without under range stage 210 and over range stage 220, the differential pairs in stages 212, 214, 216 and 218, will each, in succession, ideally produce a single triangular wave. When the outputs from the folding stages are summed, to produce complementary output signals INA and NOTA, the resulting signals have the appearance of a repetitive triangular wave with a frequency of K times the frequency of the input ramp, where K is the number of folding pairs of stages in the circuit (in FIG. 2, without under range stage 210 and over range stage 220, K equals 2).

If, at a particular point in time, the analog input signal $V_{IN}$ equals a reference voltage which is coupled to one of the "interior" folding stages (for example, $V_{IN}$ equals $V_{R4}$ of folding stage 214), the differential pair transistors 214C and 214D are balanced and have collector currents each equal to one-half of the current from current source 214E (neglecting base currents). Ideally, the adjacent folds 212 and 216 should be off and produce no output. However, when the voltage difference between reference taps is small (for example, less than a few hundred millivolts), the adjacent folding stages are not completely switched off and transistors 212D and 216C are not completely shut off. The currents through transistors 212D and 216C are equal because current sources 212E and 216E are equal and the voltage differences between reference taps are equal. As a result, the voltage drops across load resistors 214A and 216A are equal and only wired-OR transistors 214B and 216B are on. Because the currents through wired-OR transistors 214B and 216B are equal and because their base emitter voltage drops are equal, the output of folding stage 214 is balanced (zero). Thus, an input voltage equal to an interior reference voltage causes a differential output of zero since equal currents in adjacent folds, which are not completely switched, cause equal voltage drops.

By contrast, if the analog input signal $V_{IN}$ equals a reference voltage which is coupled to one of the two end folding stages (for example, $V_{IN}$ equals $V_{R2}$), the differential pair transistors in folding stage 212 are balanced and have equal collector currents. As in the previous example, transistor 214C of the adjacent folding stage is not completely switched off resulting in a non-zero current through transistor 214C. Consequently, the voltage drop across load resistor 212A is not equal to the drop across load resistor 214A (the latter drop being due to the sum of the currents through transistors 212D of folding stage 212 and 214C of folding stage 214). Wired-OR transistors 212B and 214B are on and the difference between the voltage drops across load resistors 212A and 214A is transferred to the output. Consequently, an input voltage level equal to one of the extreme reference voltages results in an unbalanced (non-zero) differential output because of the non-symmetry of folding stages above and below the active folding stage.

As previously noted, the output of first folding network 22 should be, in theory, a triangular wave form. In practice, however, the output resembles a triangular wave which has been rounded at the extreme values (at the peaks and troughs). In fact, the output resembles a sinusoid. The wave form shape is due to the imperfect switching of differential pairs in the folding stages and results in "dead zones" or extremely non-linear areas at the peaks and troughs where the output may be almost constant despite a change in the input. As can be appreciated, information is lost and the accuracy of the ADC suffers if the problem is not corrected.

Double folding circuit 20 of the present invention substantially reduces the errors caused by the foregoing asymmetry. As illustrated in FIG. 2 (which represents first folding network 22 but is equally representative of second folding network 24), an additional folding stage and reference voltage have been added to each end of first folding network 22. Thus, due to the presence of under range folding stage 210, folding stage 212 is now in the interior of first folding network 22; similarly, due to the presence of over range folding stage 220, folding stage 218 is now in the interior of first folding network 22. Input voltages equal to $V_{R2}$ or $V_{R8}$ will now result in balanced outputs for first folding network 22.

A double folding circuit 20, such as illustrated in FIG. 1, substantially reduces the problem of dead zones at the extreme values of the folding circuit output. In the present invention, second folding network 24 resembles first folding network 22; however, the reference voltages which are coupled to the differential pairs of the folding stages in second folding network 24 are halfway between the reference voltages between adjacent folds of first folding network 22. This can be accomplished with additional voltage taps in the reference voltage resistor network and causes the outputs of first folding network 22 and second folding network 24 to be offset from each other by 90°. Consequently, the two outputs of first folding network 22 can be represented by INA = $\frac{1}{2}$ sin $\Theta$ and NOTA = $-\frac{1}{2}$ sin $\Theta$ while the outputs of second folding network 24 can be represented by INB = $\frac{1}{2}$ cos $\Theta$ and NOTB = $-\frac{1}{2}$ cos $\Theta$. Each output, therefore, is linear at its zero crossing point where linearity is most important.

To generate more bits from an ADC, typical existing interpolation methods employ resistive networks to generate new folding signals between the original folding signals. As illustrated in the block diagram of FIG. 1, however, interpolation circuit 30 of the present invention employs a series of interpolation stages, each of which generates interpolated folding signals and outputs signals from which one bit of the ADC output can be formed. A first interpolation stage 32 derives output signals which are processed by a first sample latch 42 to generate the first (most significant) bit of the least significant bits of ADC 10. First interpolation stage 32 also sends signals to the succeeding interpolation stage (not shown); eventually, signals reach Lth interpolation stage 34 which generates the least significant bit of ADC 10 through Lth sample latch 34 (where L equals the number of least significant bits). Each interpolation stage includes two multiplier networks. For example, first interpolation stage 32 includes a first multiplier network 310 and a second multiplier network 320; Lth interpolation stage 34 includes a Jth − 1 multiplier network 350 and a Jth multiplier network 360 (where J = 2 × L).

Figure 3:
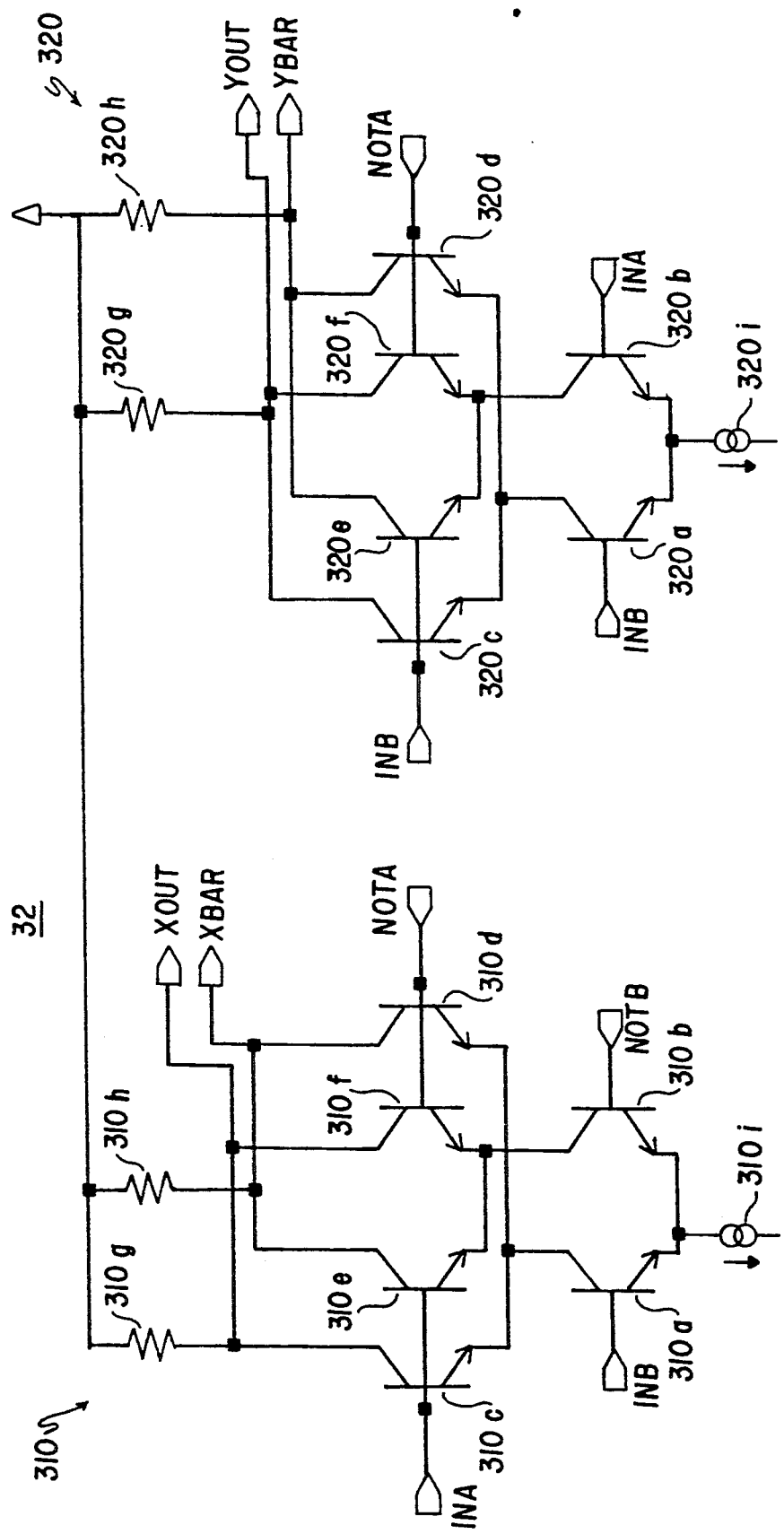
FIG. 3 illustrates a schematic diagram of one embodiment of one stage of the interpolation circuit of the present invention.

FIG. 3 illustrates one embodiment of an interpolation stage, such as first interpolation stage 32. The elements and connections of first multiplier network 310 and second multiplier network 320 are the same. Each has a first differential pair, transistors A and B; a second differential pair, transistors C and D; a third differential pair, transistors E and F; two load resistors G and H; and a current source I. First interpolation stage 32 receives four input signals (INA, NOTA, INB and NOTB) from double folding circuit 20. As will be appreciated, the two multiplier networks 350 and 360 of Lth interpolation stage 34 receive the four outputs from the previous interpolation stage. The first differential pair of first multiplier network 310 receives signals INB and NOTB (from second folding network 24 of double folding circuit 20) and the second and third differential pairs receive signals INA and NOTB (from first folding network 22 of double folding circuit 20). The first differential pair of second multiplier network 320 receives signals INA and INB and the second and third differential pairs receive signals INB and NOTA.

The outputs of first multiplier network 32 are XOUT and XBAR, which are complements of each other, and the outputs of second multiplier network 320 are YOUT and YBAR, which are compliments of each other.

First multiplier network 310, using four quadrant multiplication, multiplies the differential A signal (INA minus NOTA) with the differential B signal (INB minus NOTB) and produces complementary output signals XOUT and XBAR whose differential signal (XOUT minus XBAR) has a zero crossing when either INA equals NOTA or INB equals NOTB.

Mathematically, with INA = $\frac{1}{2}$ sin $\Theta$, NOTA = $-\frac{1}{2}$ sin $\Theta$, INB = $\frac{1}{2}$ cos $\Theta$ and NOTB = $-\frac{1}{2}$ cos $\Theta$, differential input signal A can be represented by sin $\Theta$ and differential signal B can be represented by cos $\Theta$. Then, differential output signal X = GAB, (where G equals the gain of first multiplier network 310). Expanding, X = G(sin $\Theta$ cos $\Theta$) or (G/2)(sin 2$\Theta$).

Second multiplier 320, also using four quadrant multiplication, multiplies the difference between the differential A signal and the differential B signal with the sum of the differential A signal plus the differential B signal and produces complementary output signals YOUT and YBAR whose differential signal (YOUT minus YBAR) has a zero crossing when either INB equals INA or INB equals NOTA.

Mathematically, differential output signal Y is equal to G(YOUT − YBAR) or G(INB − NOTA)(INB −INA) which equals G(cos $\Theta$/2 + sin $\Theta$/2)(cos $\Theta$/2 − sin $\Theta$/2). This can be reduced to (G/4)(cos$^2$ $\Theta$ − sin$^2$ $\Theta$) or Y = (G/4)(cos2$\Theta$).

Figure 5:
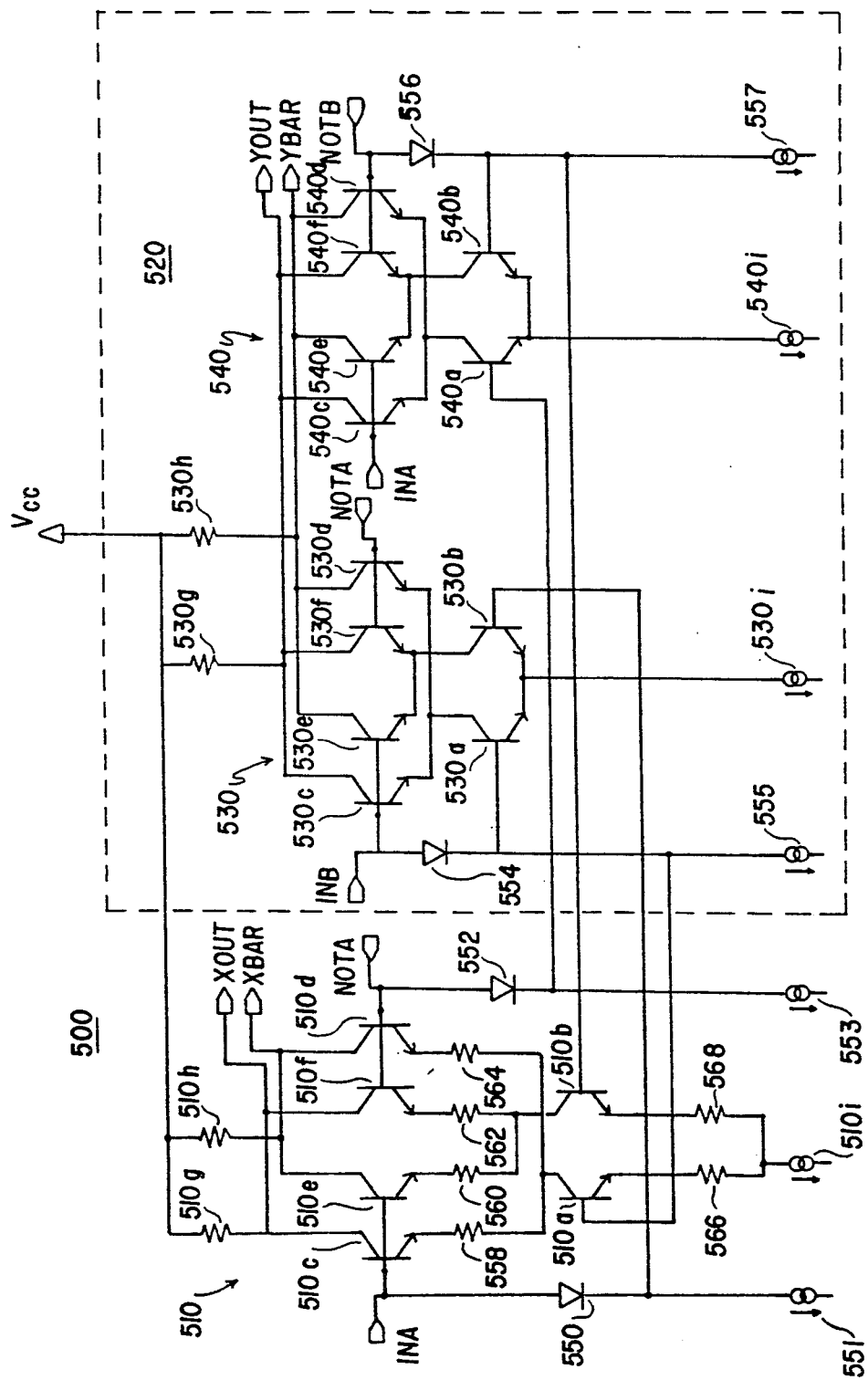
FIG. 5 illustrates a schematic diagram of another embodiment of one stage of the interpolation circuit of the present invention.

Since gain of X and Y signals differ by a factor of 2, the gain is matched with degeneration resistors as shown in FIG. 5 (resistors 558, 560, 562, 562).

Differential output signals X and Y have a frequency which is twice the frequency of differential input signals A and B. Each subsequent interpolation stage doubles the frequency of the differential output signals and an additional bit of information is obtained from differential output signal Y.

Consequently, first multiplier network 310 combines the previously obtained zero crossings (from double folding circuit 20) while second multiplier network 320 generates new zero crossings that are halfway between the zero crossings of the differential input signals. First sample latch 42 receives signals YOUT and YBAR and has an output of a first logic level when YOUT is greater than YBAR and has an output of a second logic level when YOUT is less than YBAR. The output from first sample latch 42 is the first least significant bit of ADC 10.

Figure 4:
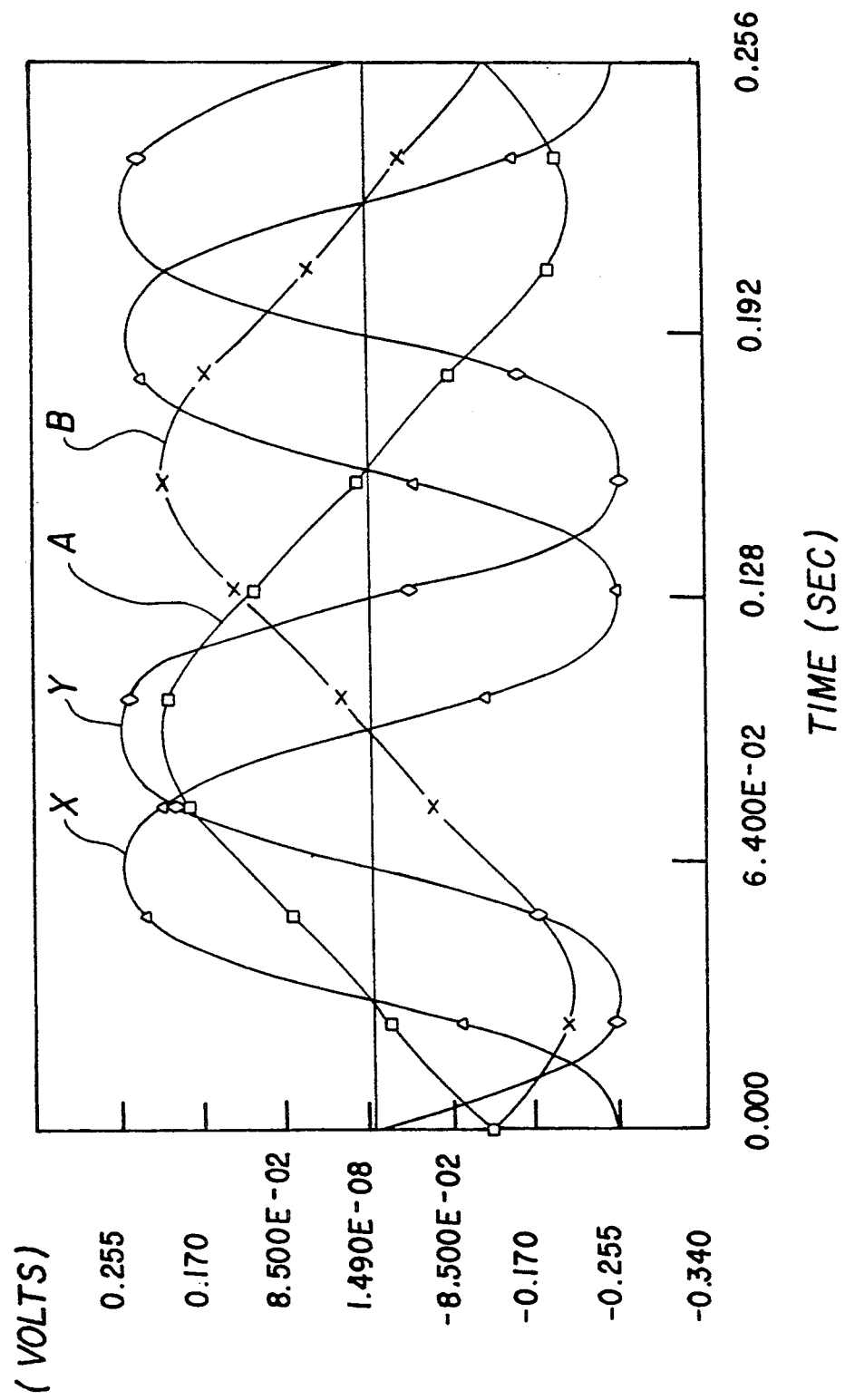
FIG. 4 illustrates wave-forms of the present invention from measurements taken at various points in the circuit of FIG. 1.

FIG. 4 illustrates wave forms of the inputs and outputs of an interpolation stage, such as first interpolation stage 32. Wave form A is the differential input signal A equal to the difference between INA and NOTA. Wave form B is the differential input signal B equal to the difference between INB minus NOTB. Wave form X is the differential output signal X equal to the difference between XOUT and XBAR. Wave form Y is the differential output signal Y equal to the difference between YOUT and YBAR.

As detailed above and as can be seen from FIG. 4, output signal X has zero crossings when either differential input signal A or differential input signal B have zero crossings. Output signal Y has zero crossings whenever the absolute values of differential input signals A and B are equal. It can also be seen that the frequency of differential output signals X and Y is double the frequency of differential input signals A and B.

FIG. 5 illustrates a preferred embodiment of an interpolation stage. A first multiplier network 510 multiplies differential input signals A and B to produce output signals XOUT and XBAR and a second multiplier network 520 produces YOUT and YBAR. Although first multiplier network 510 resembles first multiplier network 310 of first interpolation stage 32, second multiplier network 520 includes two parallel multipliers 530 and 540 with complementary input connections. Each of the three multipliers 510, 530 and 540 includes a first differential pair of transistors, A and B; a second differential pair of transistors, C and D; a third differential pair E and F; and a current source I. First and second multiplier networks 510 and 520 further include load resistors G and H which are coupled to $V_{cc}$.

In order to substantially reduce voltage level shifting of input signals and offset errors due to base current loading of the previous interpolation stage, first multiplier network 510 includes level shifting diodes 550 and 552, and their associated current sources 551 and 553. Second multiplier network 520 includes level shifting diodes 554 and 556, and their associated current sources 555 and 557. Because twice the current is now flowing through load resistors 530G and 530H, the values of the resistors are halved in order to maintain the necessary voltage swing. As previously noted, the small signal gain of second multiplier network 520 is halved. Therefore, the small signal gain of first multiplier network 510 is reduced by degeneration resistors 558, 560, 562, 564, 566 and 568 added to first multiplier network 510.

EXAMPLE

Referring again to FIG. 1, in one embodiment of an ADC incorporating the double folding circuit 20 and interpolation circuit 30 of the present invention, coarse flash converter 12 generates four most significant bits along with an over range bit. Each of the two folding networks 22 and 24 of double folding circuit 20 incorporates 4 folding stages in addition to under range stages 210 and 26 and over range stages 220 and 28. Interpolation circuit 30 includes 8 interpolation stages and 8 sample latches to generate 8 least significant bits, for a total of 12 bits as the output of ADC 10.

ADC 10 can accurately process analog input signals having frequencies up to 25 megahertz over a full scale range from −2 to +2 volts. Power dissipation is approximately 1.1 watts and no external track and hold circuit is necessary. Furthermore, the cost of such an ADC is extremely low.

By comparison, existing 12 bit ADC's are not capable of processing input frequencies as high as 25 megahertz (some are limited, for example, to approximately 5 megahertz) and may dissipate approximately 10 watts of power.

Although the present invention has been described in detail, it should be understood the various changes, substitutions and alterations can be made herein without departing from the spirit and scope of the invention as defined by the appended claims.

What is claimed is:

1. An ADC circuit for converting an analog input signal which varies over an input range into a digital code having a plurality of binary output bits, comprising:

folding circuitry including:

means for providing a plurality of first reference voltages which span the input range;

first folding means responsive to the analog input signal and said first reference voltages for generating a first folded signal and a second folded signal; and means for substantially reducing offset errors in said first and second folded signals, including:

means for providing a second reference voltage being less than the lowest of said first reference voltages;

second folding means coupled to said first folding means, said second folding means responsive to the analog input signal and said second reference voltage;

means for providing a third reference voltage being greater than the highest of said first reference voltages; and third folding means coupled to said first folding means, said third folding means responsive to the analog input signal and said third reference voltage;

interpolation circuitry coupled to said folding circuitry including:

a first interpolation stage for providing a first output signal and a second output signal; and latching means responsive to said second output signal of said first interpolation stage for providing one of the binary output bits of the ADC circuit.

2. The ADC circuit of claim 1 wherein said first folding means includes:

a plurality of folding stages, each coupled to the analog input signal and a selected one of said first reference voltages.

3. The ADC circuit of claim 1 wherein:

said first folded signal is defined by a sine function.

4. The ADC circuit of claim 3 wherein:

said second folded signal is defined by a cosine function.

5. The ADC circuit of claim 1 wherein said first interpolation stage comprises:

first multiplier means coupled to said folding circuitry for deriving said first output signal using said first and second folded signals, said first output signal being a function of sin 2Θ; and second multiplier means coupled to said folding circuitry for deriving said second output signal using said first and second folded signals, said second output signal being a function of cos 2Θ.

6. The ADC circuit of claim 1 and further including at least one additional interpolation stage coupled in series with said first interpolation stage, each of said additional interpolation stages comprising:

third multiplier means for deriving a third output signal being a function of sin 2Θ; and fourth multiplier means for deriving a fourth output signal being a function of cos 2Θ;

wherein said third and fourth output signals of each said additional interpolation stage are derived using said third and fourth output signals of the previous additional interpolation stage in the series; and means coupled to each of said fourth differential outputs for providing a binary output bit of the ADC circuit.

7. The ADC circuit of claim 1 wherein:

said first interpolation stage includes multiplier means responsive to each of said first and second folded signals.

8. The ADC circuit of claim 7 wherein:

said multiplier means includes a four quadrant multiplier network.

9. An apparatus for converting an analog input signal which varies between an upper input value and a lower input value into a digital format, comprising:

first means for receiving the analog input signal and for generating at least a first folded signal;

means coupled to said first means for reducing offset errors in said first folded signal, comprising:

means for balancing said first folded signal when said analog input signal is substantially equal to said upper input value; and means for balancing said first folded signal when said analog input signal is substantially equal to said lower input value; and multiplier means for receiving said first folded signal and for deriving an interpolated output signal by multiplying said first folded signal.

10. The apparatus of claim 9 wherein:

said first means includes means for generating a second folded signal and in which said first folded signal is a function of sin Θ and said second folded signal is a function of cos Θ.

11. The apparatus of claim 10 wherein:

said multiplier means includes means for deriving a first interpolated output signal being a function of sin 2Θ and a second interpolated output signals being a function of cos 2Θ.

12. The apparatus of claim 9 wherein:

said multiplier means includes a plurality of interpolation stages, each having first and second multiplier networks.

13. The apparatus of claim 9 and further including:

means responsive to said multiplier means for providing a binary bit representative of the analog input signal.

14. The apparatus of claim 11 further including means, responsive to said second interpolated output signal, for providing a binary bit representative of the analog input signal.

15. An apparatus for converting an analog input signal into a digital format, comprising:

first means for receiving the analog input signal, comprising:

a first double folding network for generating at least a first folded signal being a function of sin Θ; and a second folding network for generating a second folded signal being a function of cos Θ; and multiplier means for receiving said first folded signal and for deriving an interpolated output signal by multiplying said first folded signal.

16. An apparatus for converting an analog input signal into a digital format, comprising:

first means for receiving the analog input signal and for generating at least a first folded signal, said first means including means for reducing offset errors in said first folded signal due to certain values of the analog input signal; and multiplier means for receiving said first folded signal and for deriving an interpolated output signal by multiplying said first folded signal, wherein said offset errors are reduced before said first folded signal is applied to said multiplier means in order to derive said interpolated output signal.

* * * * *